United States Patent
Mizunuma et al.

(10) Patent No.: US 10,498,025 B2
(45) Date of Patent: Dec. 3, 2019

(54) WIRELESS COMMUNICATION MODULE

(71) Applicant: Murata Manufacturing Co., Ltd., Kyoto (JP)

(72) Inventors: Ryuken Mizunuma, Kyoto (JP); Kaoru Sudo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/230,064

(22) Filed: Dec. 21, 2018

(65) Prior Publication Data

US 2019/0123438 A1    Apr. 25, 2019

Related U.S. Application Data

(63) Continuation of application No. 15/491,263, filed on Apr. 19, 2017, now Pat. No. 10,193,222, which is a
(Continued)

(30) Foreign Application Priority Data

Oct. 20, 2014    (JP) .................................. 2014-213292

(51) Int. Cl.
  *H01Q 1/22*    (2006.01)
  *H01Q 1/38*    (2006.01)
  (Continued)

(52) U.S. Cl.
  CPC ............. *H01Q 1/526* (2013.01); *H01L 23/66* (2013.01); *H01Q 1/2283* (2013.01); *H01Q 1/38* (2013.01);
  (Continued)

(58) Field of Classification Search
  CPC ...... H01Q 1/2283; H01Q 13/08; H01Q 19/24; H01L 23/66; H01L 2924/19041;
  (Continued)

(56) References Cited

U.S. PATENT DOCUMENTS

| | | | |
|---|---|---|---|
| 6,181,278 B1 | 1/2001 | Kakimoto | |
| 7,649,499 B2 * | 1/2010 | Watanabe | ............. H01L 25/162 343/700 MS |

(Continued)

FOREIGN PATENT DOCUMENTS

| | | |
|---|---|---|
| JP | 3472430 B2 | 12/2003 |
| JP | 2006-067375 A | 3/2006 |

(Continued)

OTHER PUBLICATIONS

International Search Report issued in Application No. PCT/JP2015/078920 dated Nov. 24, 2015.
(Continued)

*Primary Examiner* — Khai M Nguyen
(74) *Attorney, Agent, or Firm* — Pearne & Gordon LLP

(57) ABSTRACT

A ground layer is disposed within a dielectric substrate. An antenna pattern that operates as an antenna is disposed so as to be closer to a first surface of the dielectric substrate than the ground layer is. A high-frequency device that supplies a high-frequency signal to the antenna pattern is mounted in or on a second surface of the dielectric substrate, which is opposite to the first surface. A plurality of signal conductor columns and a plurality of ground conductor columns that are made of a conductive material project from the second surface. Each of the signal conductor columns is connected to the high-frequency device by a wiring pattern, which is provided in or on the dielectric substrate, and the ground conductor columns are connected to the ground layer.

9 Claims, 7 Drawing Sheets

Related U.S. Application Data continuation of application No. PCT/JP2015/078920, filed on Oct. 13, 2015.

(51) Int. Cl.
| | | |
|---|---|---|
| *H01Q 1/52* | (2006.01) | |
| *H01L 23/66* | (2006.01) | |
| *H01Q 19/24* | (2006.01) | |
| *H01Q 21/06* | (2006.01) | |
| *H01Q 13/08* | (2006.01) | |

(52) U.S. Cl.
CPC .......... *H01Q 13/08* (2013.01); *H01Q 21/062* (2013.01); *H01Q 21/065* (2013.01); *H01L 2223/6677* (2013.01); *H01L 2224/16227* (2013.01); *H01L 2924/15192* (2013.01); *H01L 2924/15321* (2013.01); *H01L 2924/19041* (2013.01); *H01L 2924/19042* (2013.01); *H01L 2924/19105* (2013.01); *H01Q 19/24* (2013.01)

(58) Field of Classification Search
CPC . H01L 2924/15321; H01L 2924/15192; H01L 2224/16227; H01L 2223/6677; H01L 2924/19105; H01L 2924/19042
USPC .......................... 343/700 MS, 725, 841, 846
See application file for complete search history.

(56) References Cited

U.S. PATENT DOCUMENTS

| 7,782,624 | B2* | 8/2010 | Fujii ................... H01L 23/3128 |
| | | | 257/686 |
| 7,852,281 | B2 | 12/2010 | Choudhury |
| 9,337,526 | B2* | 5/2016 | Hong ................... H01Q 1/2283 |
| 2008/0191956 | A1 | 8/2008 | Watanabe |
| 2009/0168367 | A1 | 7/2009 | Fujii |
| 2010/0053023 | A1 | 3/2010 | Shtrom et al. |
| 2013/0257668 | A1 | 10/2013 | Rao et al. |
| 2014/0145883 | A1 | 5/2014 | Baks et al. |
| 2014/0225795 | A1 | 8/2014 | Yu |

FOREIGN PATENT DOCUMENTS

| JP | 2014-179821 A | 9/2014 |
| WO | 2007/049376 A1 | 5/2007 |

OTHER PUBLICATIONS

Written Opinion issued in Application No. PCT/JP2015/078920 dated Nov. 24, 2015.

* cited by examiner

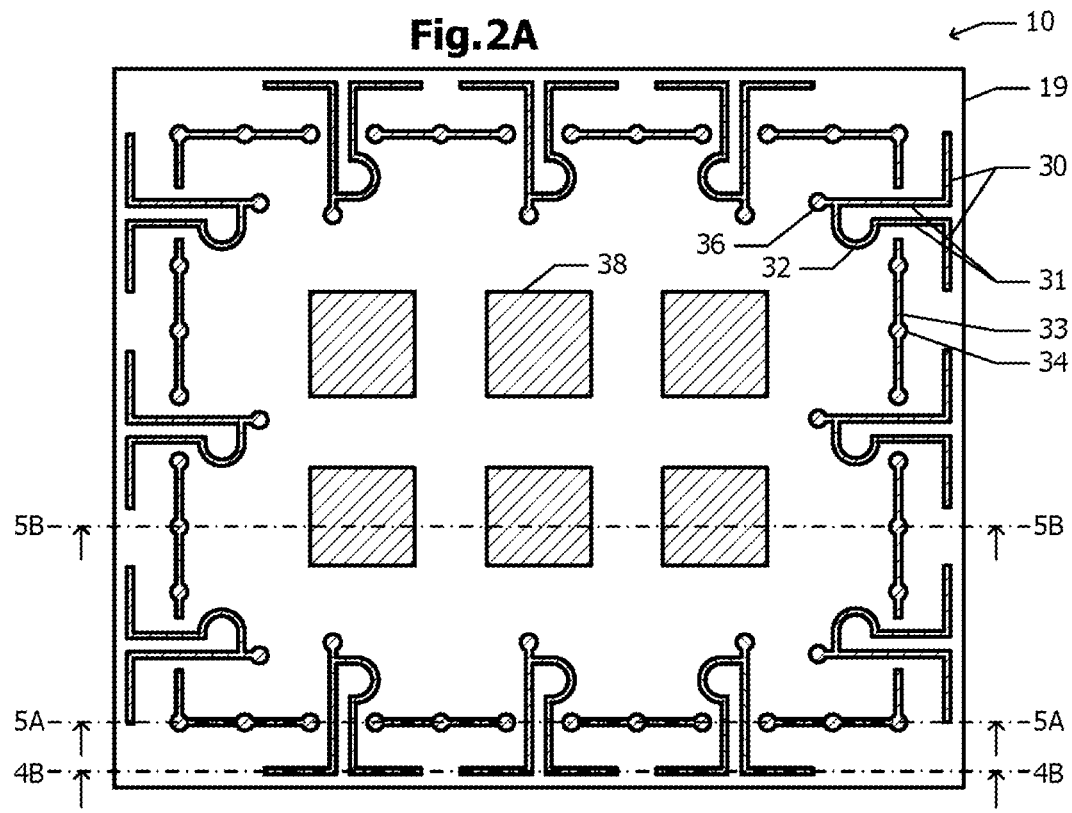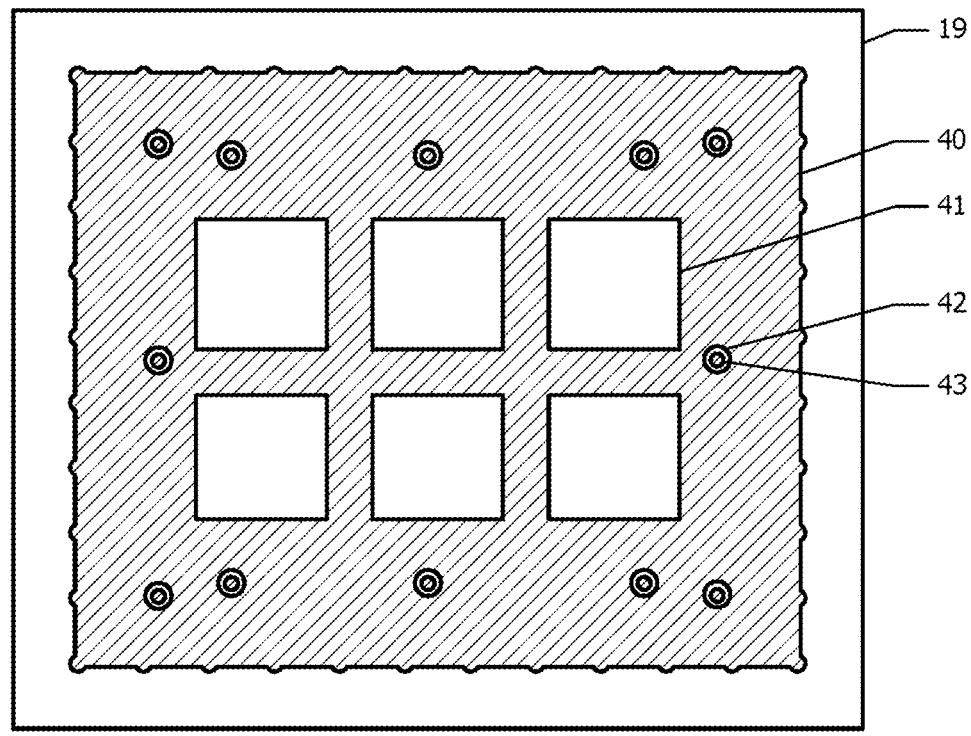

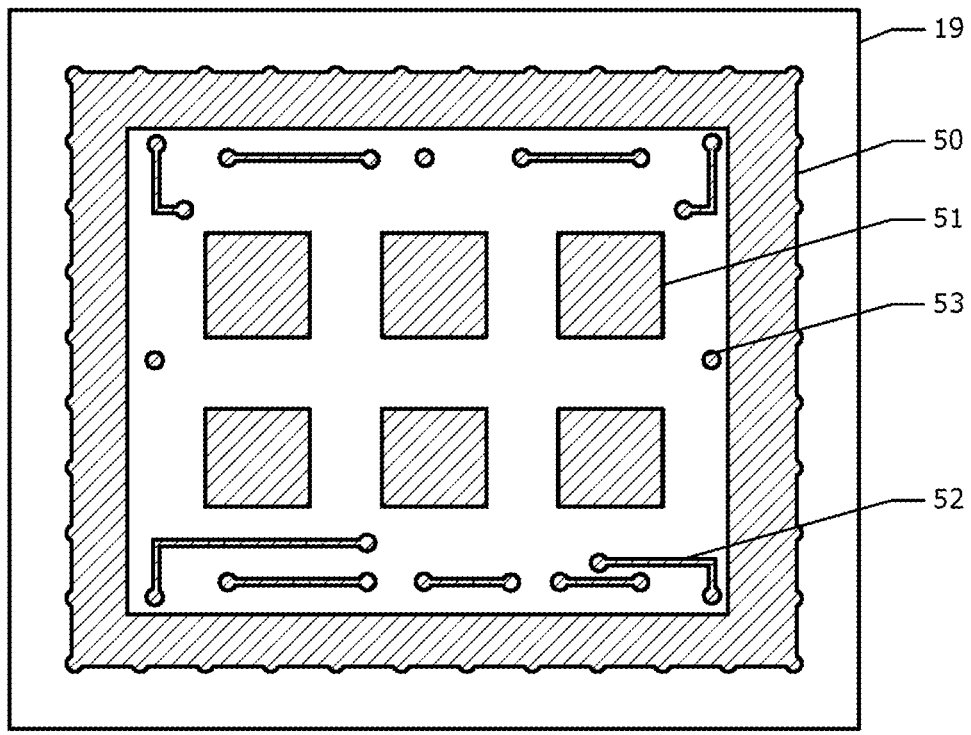
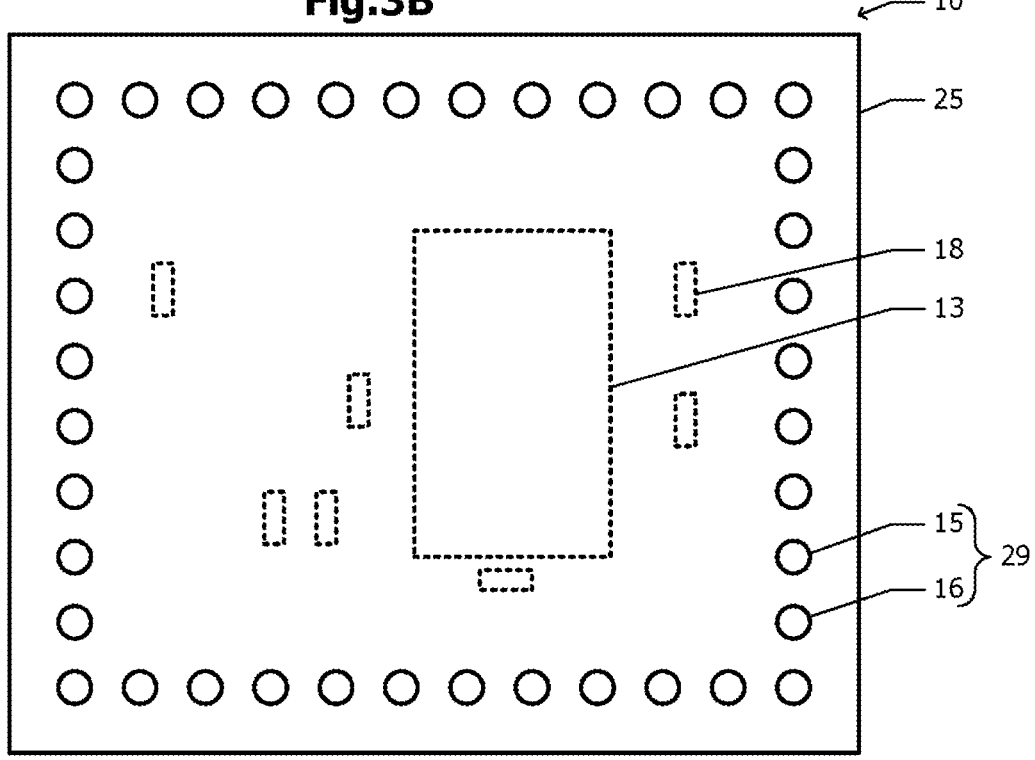

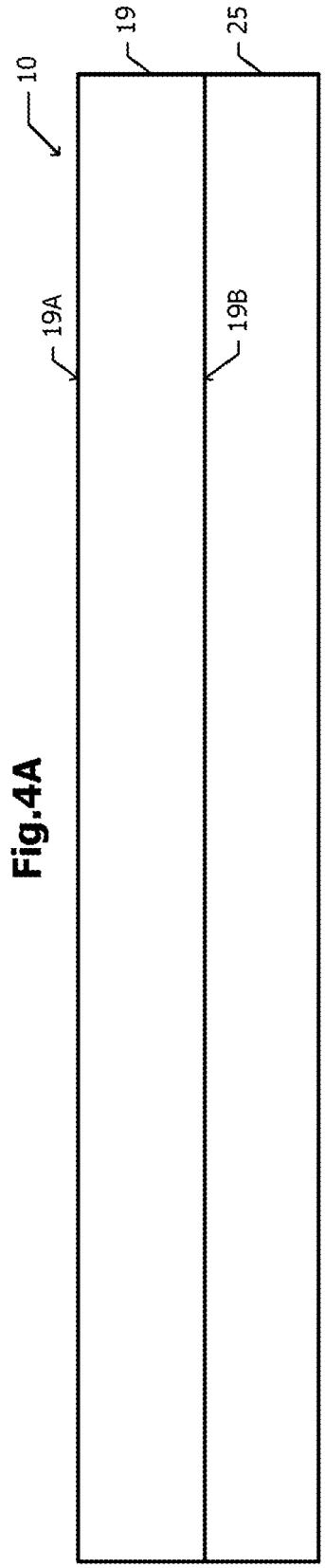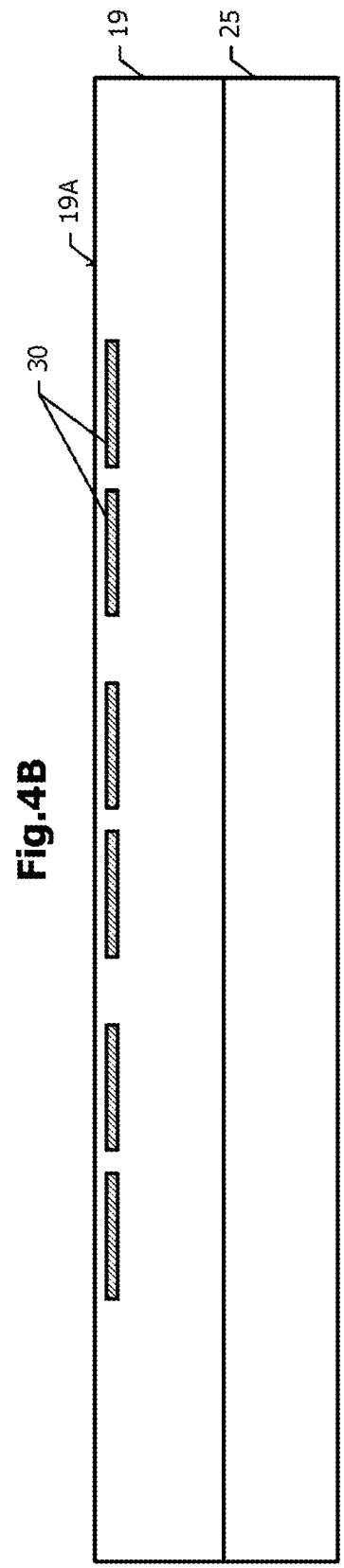

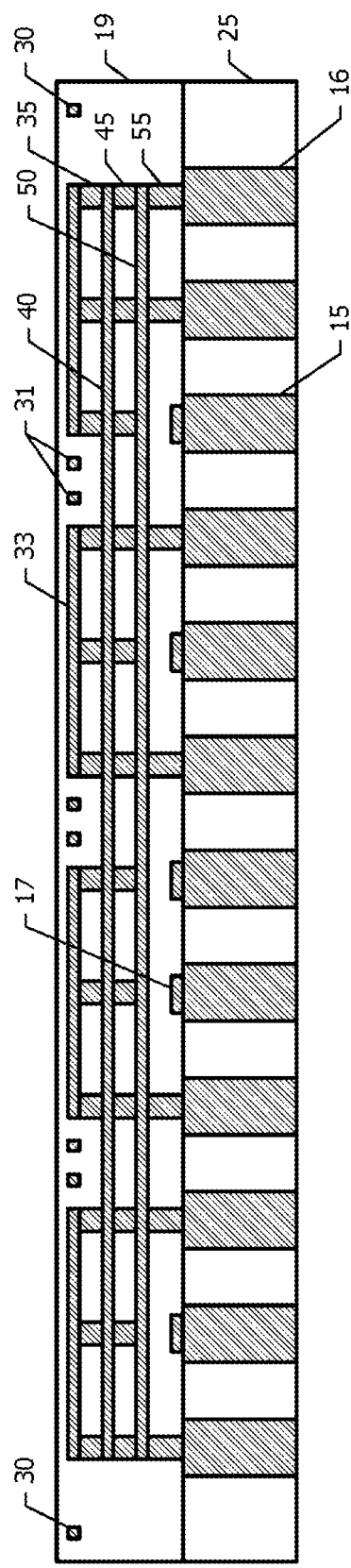
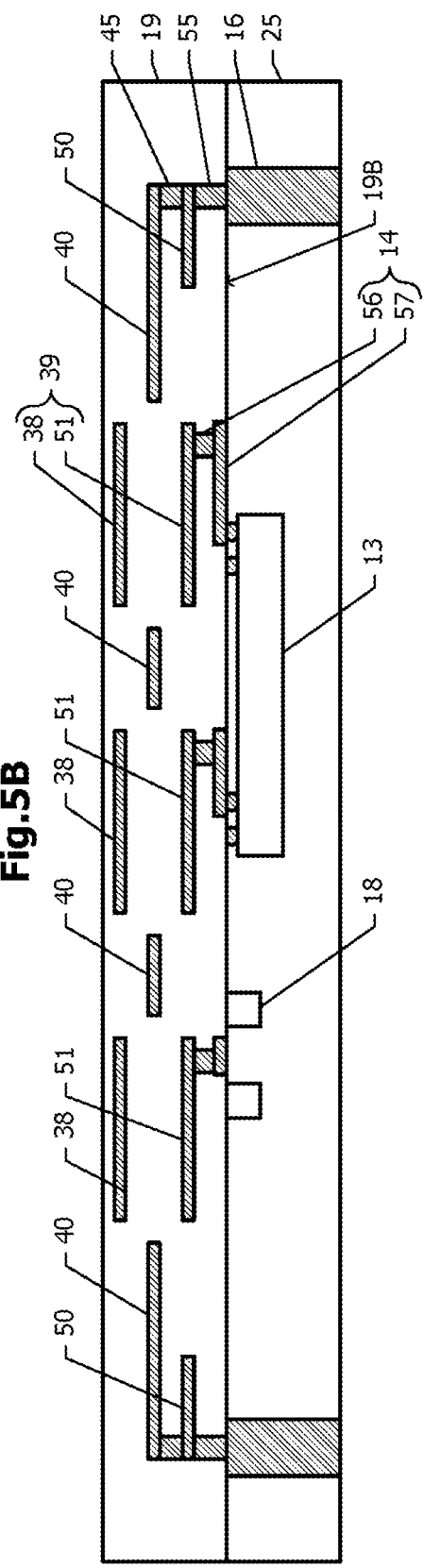

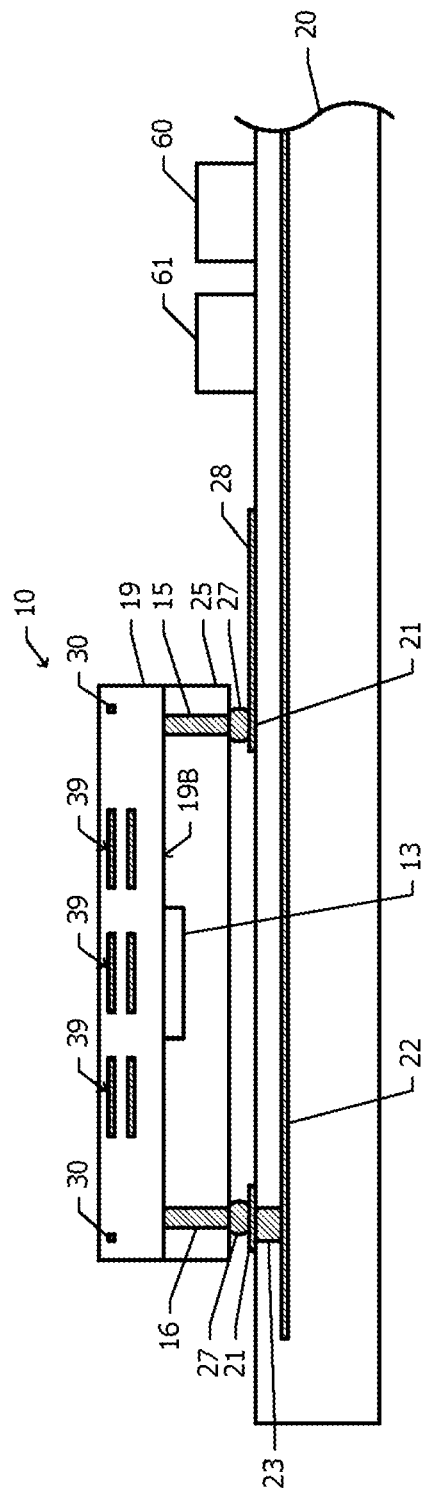

WIRELESS COMMUNICATION MODULE

This is a continuation of U.S. patent application Ser. No. 15/491,263 filed Apr. 19, 2017, which is a continuation of International Application No. PCT/JP2015/078920 filed on Oct. 13, 2015 which claims priority from Japanese Patent Application No. 2014-213292 filed on Oct. 20, 2014. The contents of these applications are incorporated herein by reference in their entireties.

BACKGROUND OF THE DISCLOSURE

Field of the Disclosure

The present disclosure relates to a wireless communication module that includes a high-frequency device and an antenna.

Description of the Related Art

Patent Document 1 and Patent Document 2 each disclose an antenna-integrated module that includes an antenna and a high-frequency semiconductor device integrated with each other.

The antenna-integrated module disclosed in Patent Document 1 has a multilayer structure in which a first semiconductor layer, a first dielectric substrate, a second semiconductor layer, a second dielectric substrate, and a third semiconductor layer are stacked on top of one another in this order. The first semiconductor layer includes a first ground conductor and a microstrip antenna. The second semiconductor layer includes a second ground conductor. The third semiconductor layer includes a third ground conductor and a power supply circuit.

A high-frequency device is mounted in or on a surface of the second dielectric substrate, in or on which a power supply circuit is formed. A coupling hole is formed in the second ground conductor. The power supply circuit and the microstrip antenna are coupled to each other via the coupling hole. The first ground conductor, the second ground conductor, and the third ground conductor are connected to one another via through holes. With this configuration, the ground of a high-frequency circuit can be stabilized.

In the antenna-integrated module disclosed in Patent Document 2, a wireless region and an antenna region are defined in or on one surface of a dielectric substrate. A high-frequency device is mounted in the wireless region. The wireless region and the antenna region are coated with a sealing-resin layer. The high-frequency device in the wireless region is also coated with the sealing-resin layer. A radiating element of an antenna and a shield layer shielding the high-frequency device are simultaneously formed on the sealing-resin layer.

Patent Document 1: Japanese Patent No. 3472430
Patent Document 2: Japanese Unexamined Patent Application Publication No. 2014-179821

BRIEF SUMMARY OF THE DISCLOSURE

In the antenna-integrated module disclosed in Patent Document 1, the high-frequency device is not shielded. In the antenna-integrated module disclosed in Patent Document 2, it is difficult to arrange the radiating element and a ground conductor in a multilayer manner. In order to cause a millimeter-wave antenna to favorably operate, it is desirable that the radiating element and the ground conductor be arranged in a multilayer manner.

It is an object of the present disclosure to provide a wireless communication module capable of effectively shielding a high-frequency device and arranging an antenna pattern, which operates as an antenna, and a ground conductor in a multilayer manner.

A wireless communication module according to a first aspect of the present disclosure includes a dielectric substrate, a ground layer that is disposed within the dielectric substrate, an antenna pattern that is disposed so as to be closer to a first surface of the dielectric substrate than the ground layer is and that operates as an antenna, a high-frequency device that is mounted in or on a second surface of the dielectric substrate, which is opposite to the first surface, and that supplies a high-frequency signal to the antenna pattern, and a plurality of signal conductor columns and a plurality of ground conductor columns that project from the second surface and that are made of a conductive material. Each of the signal conductor columns is connected to the high-frequency device by a wiring pattern, which is provided in or on the dielectric substrate. The ground conductor columns are connected to the ground layer. An end of each of the plurality of signal conductor columns and an end of each of the plurality of ground conductor columns are electrically connected to terminals of a mounting substrate.

Unnecessary radiation from the high-frequency device can be blocked by the ground layer in the dielectric substrate and the ground conductor columns. In addition, unnecessary radiation from the high-frequency device can be blocked by a ground layer in the mounting substrate.

In addition to the configuration of the wireless communication module according to the first aspect of the present disclosure, in the wireless communication module according to a second aspect of the present disclosure, the antenna pattern includes a plurality of dipole antennas that are arranged along at least a portion of an outer periphery of the dielectric substrate. The wireless communication module further includes a reflector pattern that is positioned further inside than the dipole antennas when viewed in plan view and that serves as a reflector of the dipole antennas and an interlayer connection conductor that connects the reflector pattern to the plurality of ground conductor columns. The ground conductor columns serve as reflectors of the dipole antennas together with the reflector pattern.

Since the reflector pattern and the ground conductor columns serve as reflectors, radiation efficiency (antenna gain) of the dipole antennas can be improved.

In addition to the configuration of the wireless communication module according to the second aspect of the present disclosure, in the wireless communication module according to a third aspect of the present disclosure, the antenna pattern further includes a plurality of patch antennas that are positioned further inside than the dipole antennas.

Each of the dipole antennas has directivity in the lateral direction of the wireless communication module, and each of the patch antennas has directivity in a direction normal to the wireless communication module (boresight direction).

In addition to the configurations of the wireless communication modules according to the first to third aspects of the present disclosure, in the wireless communication module according to a fourth aspect of the present disclosure, the antenna pattern is configured to operate in a bandwidth of 60 GHz. The plurality of ground conductor columns are arranged so as to surround the high-frequency device when viewed in plan view. A center-to-center distance between the adjacent ground conductor columns is not more than one-quarter an effective wavelength of radio waves at a frequency of 30 GHz.

Unnecessary radiation at a frequency of 30 GHz or lower can be effectively blocked.

In addition to the configuration of the wireless communication module according to the third aspect of the present disclosure, in the wireless communication module according to the fourth aspect of the present disclosure, the center-to-center distance between the adjacent ground conductor columns is not more than one-twelfth the effective wavelength of radio waves at a frequency of 30 GHz.

The second harmonic wave and the third harmonic wave of unnecessary radiation at a frequency of 30 GHz or lower can be effectively blocked.

In addition to the configurations of the wireless communication modules according to the first to fifth aspects of the present disclosure, the wireless communication module according to the fifth aspect of the present disclosure further includes a sealing-resin layer that is disposed on the second surface of the dielectric substrate and in which the high-frequency device, the signal conductor columns, and the ground conductor columns are to be embedded.

Since the signal conductor columns and the ground conductor columns are embedded in the sealing-resin layer, the signal conductor columns and the ground conductor columns are further reliably and mechanically supported. The high-frequency device is protected by the sealing-resin layer. By thermally coupling the sealing-resin layer to the mounting substrate, the heat-dissipation characteristic of the high-frequency device can be improved.

In addition to the configurations of the wireless communication modules according to the first to sixth aspects of the present disclosure, the wireless communication module according to the sixth aspect of the present disclosure further includes a frame-shaped substrate that is joined to the second surface of the dielectric substrate and that surrounds the high-frequency device when viewed in plan view. The signal conductor columns and the ground conductor columns are accommodated in through holes, which are formed in the frame-shaped substrate.

The signal conductor columns and the ground conductor columns are reliably and mechanically supported by the frame-shaped substrate.

Unnecessary radiation from a high-frequency device can be blocked by a ground layer within a dielectric substrate and ground conductor columns. In addition, unnecessary radiation from a high-frequency device can be blocked by a ground layer within a mounting substrate.

BRIEF DESCRIPTION OF THE SEVERAL VIEWS OF THE DRAWINGS

FIG. 2A is a plan sectional view of the uppermost semiconductor layer of a dielectric substrate, and FIG. 2B is a plan sectional view of the second semiconductor layer.

FIG. 3A is a plan sectional view of the third semiconductor layer of the dielectric substrate, and FIG. 3B is a bottom view of the wireless communication module.

FIG. 4A is a side view of the wireless communication module according to the first embodiment, and FIG. 4B is a cross-sectional view taken along one-dot chain line 4B-4B of FIG. 2A.

FIG. 5A is a cross-sectional view taken along one-dot chain line 5A-5A of FIG. 2A, and FIG. 5B is a cross-sectional view taken along one-dot chain line 5B-5B of FIG. 2A.

FIG. 6 is a cross-sectional view illustrating a state where a wireless communication module according to a second embodiment is mounted in or on a mounting substrate.

DETAILED DESCRIPTION OF THE DISCLOSURE

First Embodiment

Figure 1A:
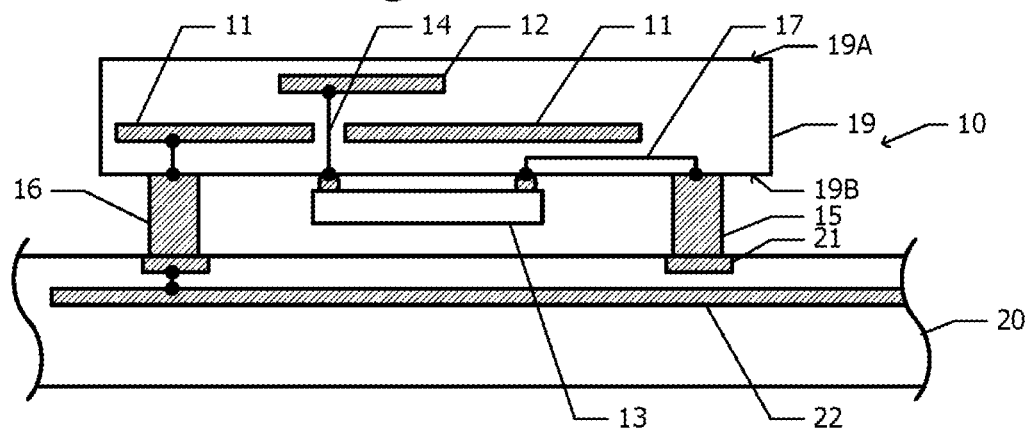
FIG. 1A is a cross-sectional view of a wireless communication module according to a first embodiment of the present disclosure.

FIG. 1A is a cross-sectional view illustrating a wireless communication module 10 according to a first embodiment of the present disclosure and a mounting substrate 20 in or on which the wireless communication module 10 is mounted. A ground layer 11 is disposed within a dielectric substrate 19. An antenna pattern 12 is disposed so as to be closer to a first surface 19A of the dielectric substrate 19 than the ground layer 11 is. The antenna pattern 12 operates as a radiating element that radiates radio waves. Note that the antenna pattern 12 may be disposed on the first surface 19A. The antenna pattern 12 includes, for example, patch antennas, printed dipole antennas, and the like.

A high-frequency device (high-frequency semiconductor integrated circuit element) 13 is mounted in or on a second surface 19B of the dielectric substrate 19 that is opposite to the first surface 19A. A terminal of the high-frequency device 13 and the antenna pattern 12 is connected to each other by one of feeders 14. The high-frequency device 13 supplies a high-frequency signal to the antenna pattern 12 via the feeder 14. A high-frequency signal received by the antenna pattern 12 is input to the high-frequency device 13 via the feeder 14.

A plurality of signal conductor columns 15 and a plurality of ground conductor columns 16 project from the second surface 19B of the dielectric substrate 19. The signal conductor columns 15 are connected to the high-frequency device 13 by wiring patterns 17, which are provided in or on the dielectric substrate 19. The ground conductor columns 16 are connected to the ground layer 11.

In the wireless communication module 10, an end of each of the plurality of signal conductor columns 15 and an end of each of the plurality of ground conductor columns 16 are electrically connected to terminals 21 of the mounting substrate 20. The mounting substrate 20 is, for example, a motherboard in or on which a central processing unit (CPU), a baseband integrated circuit element, and the like are mounted. A ground layer 22 is disposed within the mounting substrate 20. The ground layer 22 is connected to the ground layer 11 of the wireless communication module 10 by the ground conductor columns 16.

In the first embodiment, not only the ground layer 11 of the wireless communication module 10 but also the ground layer 22 of the mounting substrate 20 operate as ground planes that are paired with the antenna pattern 12. Thus, a ground plane larger than the plane dimension of the wireless communication module 10 can be ensured. As a result of the ground plane becoming large, the operations of the antennas are stabilized.

The high-frequency device 13 is shielded by the ground layer 11, which is disposed above the high-frequency device 13, and the ground layer 22, which is disposed below the high-frequency device 13. Thus, unnecessary radiation from the high-frequency device 13 in upward and downward directions can be effectively blocked. In addition, by setting the center-to-center distance between the plurality of ground conductor columns 16 to be one-quarter or less of the effective wavelength of spurious radiation from the high-frequency device 13, spurious radiation from the high-frequency device 13 in the lateral direction can be effectively suppressed. By setting the center-to-center distance between the ground conductor columns 16 to be one-twelfth or less of the effective wavelength of the spurious radiation, radiation of the second harmonic wave and the third harmonic wave of the spurious radiation can also be effectively suppressed. Here, the term "effective wavelength" refers to the actual wavelength considering the dielectric constant in a region that is focused on.

Figure 1B:
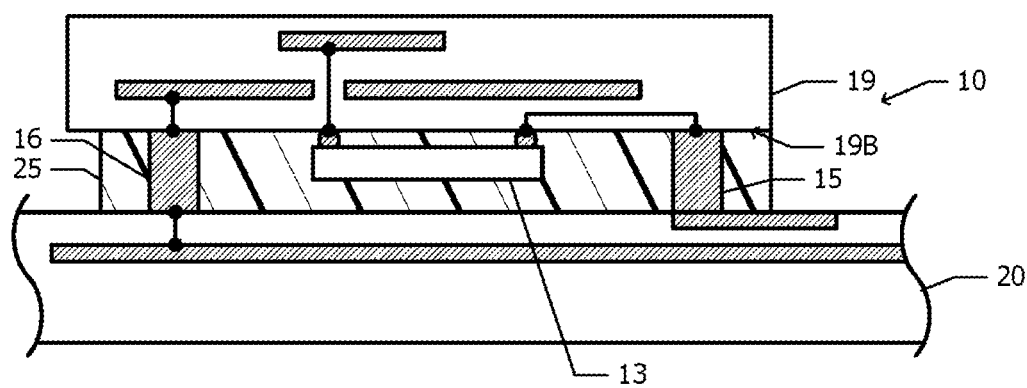
FIG. 1B is a cross-sectional view of a wireless communication module according to a first modification of the first embodiment.

FIG. 1B illustrates a cross-sectional view of the wireless communication module 10 according to a first modification of the first embodiment. The difference between the first modification and the first embodiment, which is illustrated in FIG. 1A, will be described below, and the description of the configuration common to the first modification and the first embodiment will be omitted. In the first modification of the first embodiment, the second surface 19B of the dielectric substrate 19, the high-frequency device 13, the signal conductor columns 15, and the ground conductor columns 16 are embedded in a sealing-resin layer 25. The sealing-resin layer 25 is formed by injecting a resin after the signal conductor columns 15 and the ground conductor columns 16 have been joined to the second surface 19B of the dielectric substrate 19. An end of each of the signal conductor columns 15 and an end of each of the ground conductor columns 16 are exposed at the sealing-resin layer 25.

In the first modification of the first embodiment, the sealing-resin layer 25 faces the mounting substrate 20, and thus, the coplanarity between the wireless communication module 10 and the mounting substrate 20 can be easily ensured. For example, the high-frequency device 13 and the like, which are components mounted in or on the second surface 19B of the dielectric substrate 19, are protected by the sealing-resin layer 25, and thus, a high reliability can be ensured. In addition, by thermally coupling the sealing-resin layer 25 and the mounting substrate 20 to each other, heat generated by the high-frequency device 13 can be effectively transferred to the mounting substrate 20. As a result, the heat-dissipation characteristic of the high-frequency device 13 can be improved.

Figure 1C:
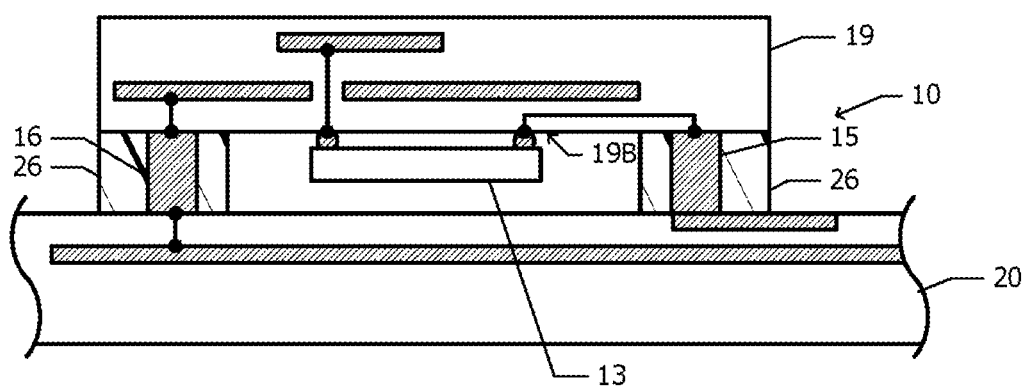
FIG. 1C is a cross-sectional view of a wireless communication module according to a second modification of the first embodiment.

FIG. 1C illustrates a cross-sectional view of the wireless communication module 10 according to a second modification of the first embodiment. The difference between the second modification and the first embodiment, which is illustrated in FIG. 1A, will be described below, and the description of the configuration common to the second modification and the first embodiment will be omitted. In the second modification of the first embodiment, a frame-shaped substrate 26 is joined to the second surface 19B of the dielectric substrate 19. The frame-shaped substrate 26 surrounds the high-frequency device 13 when viewed in plan view. The signal conductor columns 15 and the ground conductor columns 16 are accommodated in through holes formed in the frame-shaped substrate 26. After filling the through holes with the signal conductor columns 15 and the ground conductor columns 16, the frame-shaped substrate 26 is joined to the dielectric substrate 19.

In the second modification of the first embodiment, the frame-shaped substrate 26 faces the mounting substrate 20, and thus, the coplanarity between the wireless communication module 10 and the mounting substrate 20 can be easily ensured. In addition, since the signal conductor columns 15 and the ground conductor columns 16 are accommodated in the through holes of the frame-shaped substrate 26, the mechanical strength of each of the signal conductor columns 15 and the mechanical strength of each of the ground conductor columns 16 can be enhanced.

Second Embodiment

The wireless communication module 10 according to the second embodiment will now be described with reference to FIG. 2A to FIG. 5B. The wireless communication module 10 according to the second embodiment includes the dielectric substrate 19 that includes a plurality of semiconductor layers.

FIG. 2A illustrates a plan sectional view of the uppermost semiconductor layer of the dielectric substrate 19. The dielectric substrate 19 has a rectangular or square planar shape. The uppermost semiconductor layer includes a plurality of printed dipole antennas 30, a plurality of feeders 31, a plurality of baluns (balanced-to-unbalanced transformers) 32, and conductor patterns 38 of a plurality of patch antennas. The dielectric substrate 19 is made of, for example, an epoxy resin or the like. The dipole antennas 30, the feeders 31, the baluns 32, and the conductor patterns 38 of the plurality of patch antennas are made of, for example, a conductive material such as copper. Similarly, the other lower semiconductor layers are also made of a conductive material such as copper.

The plurality of dipole antennas 30 are arranged along the outer peripheral line of the dielectric substrate 19 so as to be positioned slightly further inside than the outer peripheral line. Each of the dipole antennas 30 is disposed so as to be parallel to the outer peripheral line of the dielectric substrate 19. As an example, three of the dipole antennas 30 are arranged so as to correspond to one of the sides of the dielectric substrate 19.

Each of the balanced feeders 31 extends from a corresponding one of the dipole antennas 30 toward the inside of the dielectric substrate 19. The baluns (balanced-to-unbalanced transformers) 32 are disposed at inner end portions of the corresponding feeders 31. Each of the baluns 32 causes the phase of one of the corresponding balanced feeders 31 and the phase of the other of the corresponding balanced feeders 31 to be different from each other by 180 degrees. The baluns 32 are connected to, at connection points 36, transmission lines of one of the inner layers of the dielectric substrate 19.

A reflector pattern 33 is disposed so as to be positioned slightly further inside than the dipole antennas 30 and positioned slightly further outside than the baluns 32. The reflector pattern 33 is formed of a linear conductor pattern that is disposed along the outer peripheral line of a rectangular shape slightly smaller than the dielectric substrate 19. The reflector pattern 33 is cut at positions that cross the feeders 31 so as to be insulated from the feeders 31. The gap between each of the dipole antennas 30 and the reflector pattern 33 is equal to one fourth of the effective wavelength of radio waves at the operating frequency of each of the dipole antennas 30. The reflector pattern 33 is connected to, at a plurality of connection points 34 arranged along the reflector pattern 33, the ground layer included in one of the inner layers.

The conductor patterns 38 of the plurality of patch antennas are arranged in a matrix so as to be positioned further inside than the dipole antennas 30. In the example illustrated in FIG. 1A, the conductor patterns 38 are arranged in a matrix having two rows and three columns. The row direction and the column direction are parallel to the outer peripheral line of the dielectric substrate 19.

FIG. 2B illustrates a plan sectional view of the second semiconductor layer of the dielectric substrate 19 from the top. A ground layer 40 is positioned at the second layer. When viewed in plan view, the outer periphery of the ground layer 40 matches the reflector pattern 33 (FIG. 2A) of the uppermost layer. A plurality of openings 41 and a plurality of openings 42 are formed in the ground layer 40.

The openings 41 are positioned so as to correspond to the conductor patterns 38 (FIG. 2A) of the patch antennas of the uppermost layer. Each of the openings 41 has a square planar shape larger than the corresponding conductor pattern 38.

The openings 42 are arranged at positions corresponding to the connection points 36 (FIG. 2A) of the baluns 32. Interlayer connection conductors 43 are disposed in the openings 42. The interlayer connection conductors 43 connect the baluns 32 (FIG. 2A) of the upper layer and the transmission lines of one of the lower layers to each other.

FIG. 3A illustrates a plan sectional view of the third semiconductor layer of the dielectric substrate 19 from the top. A ground layer 50, feed elements 51, transmission lines 52, and interlayer connection conductors 53 are disposed in or on the third layer. The ground layer 50 has a frame-like planar shape and is connected to the reflector pattern 33 (FIG. 2A) of the uppermost layer and the ground layer 40 (FIG. 2B) of the second layer. When viewed in plan view, the outer peripheral line of the ground layer 50 matches the reflector pattern 33 (FIG. 2A). The feed elements 51, the transmission lines 52, and the interlayer connection conductors 53 are arranged in a region surrounded by the frame-shaped ground layer 50. The transmission lines 52 and the interlayer connection conductors 53 are connected to the baluns 32 (FIG. 2A) of the uppermost layer.

FIG. 3B illustrates a bottom view of the wireless communication module 10. The sealing-resin layer 25 is in close contact with the bottom surface of the dielectric substrate 19 (FIG. 2A, FIG. 2B, and FIG. 3A). A high-frequency device (high-frequency semiconductor integrated circuit element) 13, high-frequency circuit components 18, and conductor columns 29 are embedded in the sealing-resin layer 25. The high-frequency circuit components 18 include an inductor, a capacitor, and the like. The high-frequency device 13 and the high-frequency circuit components 18 are mounted in or on the rear surface of the dielectric substrate 19 (FIG. 3A). The conductor columns 29 project from the rear surface of the dielectric substrate 19, and an end of each of the conductor columns 29 is exposed at a surface of the sealing-resin layer 25. The conductor columns 29 are made of, for example, a conductive material such as copper. The sealing-resin layer 25 is made of, for example, a thermosetting resin such as an epoxy resin or a cyanate resin.

When viewed in plan view, the plurality of conductor columns 29 are arranged so as to be equally spaced along the reflector pattern 33 (FIG. 2A). In other words, the conductor columns 29 are positioned further inside than the dipole antennas 30. The conductor columns 29 include the plurality of signal conductor columns 15 and the plurality of ground conductor columns 16. The signal conductor columns 15 are connected to the high-frequency device 13 by wiring patterns formed in or on the dielectric substrate 19 (FIG. 2A, FIG. 2B, and FIG. 3A). The ground conductor columns 16 are connected to the ground layer 50 (FIG. 3A).

FIG. 4A illustrates a side view of the wireless communication module 10. The wireless communication module 10 includes the dielectric substrate 19 and the sealing-resin layer 25. The second surface 19B that is opposite to the first surface 19A, which is the front surface of the dielectric substrate 19, is coated with the sealing-resin layer 25.

FIG. 4B is a cross-sectional view taken along one-dot chain line 4B-4B of FIG. 2A. The dipole antennas 30 are disposed within the dielectric substrate 19. The dipole antennas 30 are positioned so as to be closer to the first surface 19A than the ground layer 40 (FIG. 2B), which is one of the inner layers, is.

FIG. 5A illustrates a cross-sectional view taken along one-dot chain line 5A-5A of FIG. 2A. The dipole antennas 30, the feeders 31, and the reflector pattern 33 are disposed in or on the uppermost semiconductor layer of the dielectric substrate 19. The ground layer 40 is positioned at the second layer, and the ground layer 50 is positioned at the third layer. The reflector pattern 33 and the ground layer 40, which is positioned below the reflector pattern 33, are connected to each other by interlayer connection conductors 35. The ground layer 40 and the ground layer 50, which is positioned below the ground layer 40, are connected to each other by interlayer connection conductors 45.

The plurality of signal conductor columns 15 and the plurality of ground conductor columns 16 are embedded in the sealing-resin layer 25. An end surface of each of the signal conductor columns 15 and an end surface of each of the ground conductor columns 16 are exposed at the sealing-resin layer 25. The ground conductor columns 16 are connected to the ground layer 50 by interlayer connection conductors 55 in the dielectric substrate 19. The signal conductor columns 15 are connected to the high-frequency device 13 (FIG. 3B) by the wiring patterns 17 formed in or on the dielectric substrate 19. When viewed in plan view, the signal conductor columns 15 and the ground conductor columns 16 are positioned further inside than the dipole antennas 30.

FIG. 5B illustrates a cross-sectional view taken along one-dot chain line 5B-5B of FIG. 2A. The conductor patterns 38 of patch antennas 39 are disposed in or on the uppermost semiconductor layer of the dielectric substrate 19. The ground layer 40 is positioned at the second layer. The ground layer 50 and the feed elements 51 of the patch antennas 39 are positioned at the third layer. The feed elements 51 of the third layer and the conductor patterns 38 of the uppermost layer are electromagnetically coupled to each other via the openings 41 (FIG. 2B) formed in the ground layer 40 of the second layer. The conductor patterns 38 function as passive elements. Note that power may be directly supplied to the conductor patterns 38.

The high-frequency device 13 and the high-frequency circuit components 18 are mounted in or on the second surface 19B of the dielectric substrate 19. Power is supplied from the high-frequency device 13 to the feed elements 51 via the feeders 14. The feeders 14 include interlayer connection conductors 56, which are disposed in the dielectric substrate 19, and wiring patterns 57, which are formed in or on the second surface 19B.

The ground conductor columns 16 project from the second surface 19B of the dielectric substrate 19. The high-frequency device 13, the high-frequency circuit components 18, and the ground conductor columns 16 are embedded in the sealing-resin layer 25. The ground layer 40 and the ground layer 50 are connected to each other by the interlayer connection conductors 45. The ground layer 50 and the ground conductor columns 16 are connected to each other by the interlayer connection conductors 55.

A function of the wireless communication module 10 according to the second embodiment will now be described. The plurality of dipole antennas 30 (FIG. 2A) function as end-fire antennas that effectively radiate radio waves in a direction parallel to a substrate surface of the dielectric substrate 19 (lateral direction). The patch antennas 39 (FIG. 5B) effectively radiate radio waves in a direction normal to the substrate surface of the dielectric substrate 19 (boresight direction).

By adjusting the phases of signals that are supplied to the plurality of dipole antennas 30 and the plurality of patch antennas 39, the directivity can be arbitrarily changed in a hemispherical plane above the dielectric substrate 19.

FIG. 6 is a cross-sectional view illustrating a state where the wireless communication module 10 according to the second embodiment is mounted in or on the mounting substrate 20. The plurality of patch antennas 39 and the plurality of dipole antennas 30 are disposed in or on the dielectric substrate 19. The high-frequency device 13 is mounted in or on the second surface 19B of the dielectric substrate 19.

An end of each of the signal conductor columns 15 and an end of each of the ground conductor columns 16 are connected to the terminals 21 of the mounting substrate 20 by solder balls 27. A CPU 60 and a baseband integrated circuit element (baseband IC) 61 are mounted in or on the mounting substrate 20. The signal conductor columns 15 are connected to the baseband integrated circuit element 61 by wiring patterns 28, which are formed in or on the mounting substrate 20. The ground layer 22 is disposed within the mounting substrate 20. The ground conductor columns 16 are connected to the ground layer 22 by interlayer connection conductors 23.

A transmission operation performed by the wireless communication module 10 will now be described. An intermediate-frequency signal (IF signal) and a control signal are transmitted from the baseband integrated circuit element 61 to the high-frequency device 13. The control signal includes phase shift information of signals that are supplied to the plurality of dipole antennas 30 and the plurality of patch antennas 39 and a transmission mode command. The high-frequency device 13 up-converts an IF signal received thereby into a high-frequency signal (RF signal) in a millimeter-wave band. In addition, the RF signal is supplied to the plurality of dipole antennas 30 and the plurality of patch antennas 39 by adjusting the phase of the RF signal on the basis of the control signal. As a result, radio waves can be radiated from the dipole antennas 30 and the patch antennas 39, and the radiation intensity in a target direction can be increased.

A receiving operation performed by the wireless communication module 10 will now be described. A signal that includes phase shift information of signals received by the plurality of dipole antennas 30 and the plurality of patch antennas 39 and a reception mode command is transmitted from the baseband integrated circuit element 61 to the high-frequency device 13. The high-frequency device 13 adjusts the phases of RF signals received by the plurality of dipole antennas 30 and the plurality of patch antennas 39 and down-converts the RF signals into IF signals. The down-converted IF signals are transmitted from the high-frequency device 13 to the baseband integrated circuit element 61. As a result, reception sensitivity in a target direction can be increased.

Advantageous effects obtained by employing the configuration of the wireless communication module 10 according to the second embodiment will be described below.

Similar to the first embodiment, in the wireless communication module 10 according to the second embodiment, not only the ground layer 40 (FIG. 2B) and the ground layer 50 (FIG. 3A) of the wireless communication module 10 but also the ground layer 22 (FIG. 6) of the mounting substrate 20 operate as ground planes that are paired with the dipole antennas 30 and the patch antennas 39 (FIG. 6). Thus, a ground plane larger than the plane dimension of the wireless communication module 10 can be ensured. As a result of the ground plane becoming large, the operations of the antennas are stabilized.

The ground layer 40 (FIG. 2B) of the wireless communication module 10, the ground conductor columns 16 (FIG. 3B), and the ground layer 22 (FIG. 6) of the mounting substrate 20 serve as shield layers that shield the high-frequency device 13 (FIG. 6). Thus, unnecessary radiation from the high-frequency device 13 can be effectively blocked. In order to obtain a sufficient shielding effect, it is preferable that the center-to-center distance between the plurality of ground conductor columns 16 be one-quarter or less of the effective wavelength of spurious radiation from the high-frequency device 13. In order to suppress an increase in the center-to-center distance between the ground conductor columns 16, it is preferable that not more than one of the signal conductor columns 15 be disposed between the adjacent ground conductor columns 16. In order to effectively block radiation of the second harmonic wave and the third harmonic wave of the spurious radiation, it is further preferable that the center-to-center distance between the ground conductor columns 16 be one-twelfth or less of the effective wavelength of the spurious radiation.

According to evaluation experiments conducted by the inventors of the present application, it has been found that, when the operating frequency of the dipole antennas 30 and the operating frequency of the patch antennas 39 are within a bandwidth of 60 GHz, the spurious intensity at a frequency of 30 GHz or lower is relatively high. In a region in which the ground conductor columns 16 are disposed, the effective wavelength of radio waves at a frequency of 30 GHz is about 5.2 mm. One-quarter of the effective wavelength is about 1.3 mm, and one-twelfth of the effective wavelength is about 0.43 mm.

By injecting an underfill material between the wireless communication module 10 and the mounting substrate 20 (FIG. 6), heat generated by the high-frequency device 13 can be effectively transferred to the mounting substrate 20. In addition, since the second surface 19B of the dielectric substrate 19 is coated with the sealing-resin layer 25 (FIG. 4A), the coplanarity between the wireless communication module 10 and the mounting substrate 20 can be improved.

In the second embodiment, as illustrated in FIG. 5A, the interlayer connection conductors 35, the ground layer 40, the interlayer connection conductors 45, the ground layer 50, the interlayer connection conductors 55, and the ground conductor columns 16 are disposed below the reflector pattern 33. These grounded conductor portions serve as reflectors for the dipole antennas 30 (FIG. 2A). Since not only the reflector pattern 33 of the uppermost layer, in or on which the dipole antennas 30 are disposed, but also the conductor portions of the lower layers serve as reflectors, radiation efficiency (antenna gain) of the dipole antennas 30 can be improved.

In order to cause the conductor portions of the lower layers to operate as reflectors, it is preferable that the reflector pattern 33, the interlayer connection conductors 35, the ground layer 40, the interlayer connection conductors 45, the ground layer 50, the interlayer connection conductors 55, and the ground conductor columns 16 be arranged on a virtual plane that is parallel to the longitudinal direction of the dipole antennas 30 and perpendicular to the substrate surface of the dielectric substrate 19. It is preferable that the distance between the virtual plane and each of the dipole antennas 30 be one-quarter or less of the effective wavelength at the operating frequency of the dipole antennas 30.

In the second embodiment, as illustrated in FIG. 2A, the dipole antennas 30 are arranged along substantially the entire outer periphery of the dielectric substrate 19. As another configuration, the dipole antennas 30 may be arranged along a portion of the outer periphery of the dielectric substrate 19. For example, a configuration may be employed in which the dipole antennas 30 are arranged along two adjacent sides of the dielectric substrate 19 and are not arranged along the other two sides.

Third Embodiment

Figure 7A:
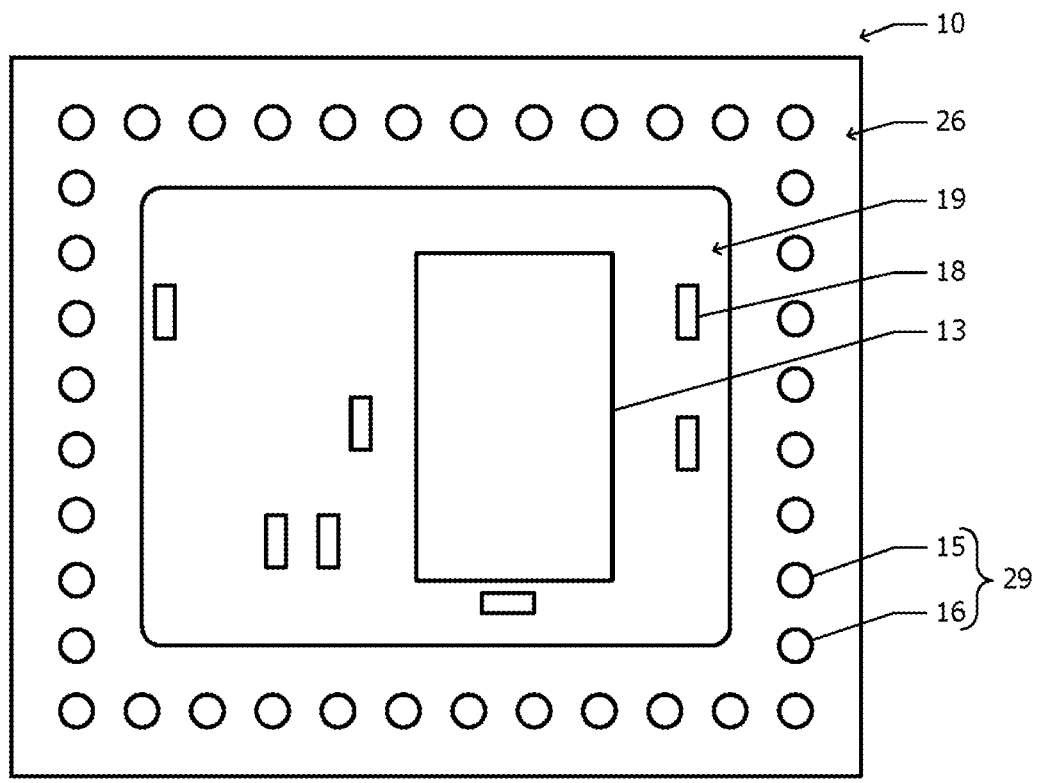
FIG. 7A and FIG. 7B are respectively a bottom view and a cross-sectional view of a wireless communication module according to a third embodiment.
Figure 7B:
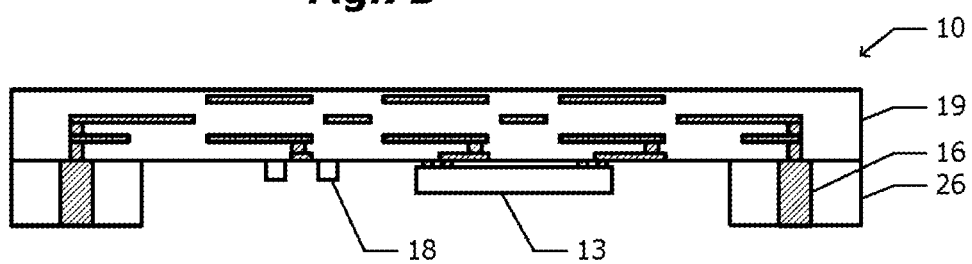

FIG. 7A and FIG. 7B are respectively a bottom view and a cross-sectional view of the wireless communication module 10 according to a third embodiment. The difference between the third embodiment and the second embodiment, which is illustrated in FIG. 2A to FIG. 6, will be described below, and the description of the configuration common to the third embodiment and the second embodiment will be omitted.

In the third embodiment, the frame-shaped substrate 26 is employed instead of the sealing-resin layer 25 (FIG. 3A to FIG. 4B) according to the second embodiment. The signal conductor columns 15 and the ground conductor columns 16 are accommodated in through holes formed in the frame-shaped substrate 26. The dielectric substrate 19 is exposed within the frame-shaped substrate 26. The high-frequency device 13 and the high-frequency circuit components 18 are disposed in a region surrounded by the frame-shaped substrate 26.

In the third embodiment, the frame-shaped substrate 26 is joined to the dielectric substrate 19 after the signal conductor columns 15 and the ground conductor columns 16 have been incorporated in the frame-shaped substrate 26. By providing the frame-shaped substrate 26, the coplanarity between the wireless communication module 10 and the mounting substrate 20 can be improved.

Although the present disclosure has been described above on the basis of embodiments thereof, the present disclosure is not limited to the embodiments. For example, each of the embodiments is an example, and it is obvious that the configurations according to the different embodiments may be partially replaced with one another or may be combined with each other. In addition, it is obvious to those skilled in the art that various changes and improvements may be made to the present disclosure.

10 wireless communication module
11 ground layer
12 antenna pattern
13 high-frequency device
14 feeder
15 signal conductor column
16 ground conductor column
17 wiring pattern
18 high-frequency circuit component
19 dielectric substrate
19A first surface
19B second surface
20 mounting substrate
21 terminal
22 ground layer
23 interlayer connection conductor
25 sealing-resin layer
26 frame-shaped substrate
27 solder ball
28 wiring pattern
29 conductor column
30 dipole antenna
31 feeder
32 balun
33 reflector pattern
34 connection point
35 interlayer connection conductor
36 connection point
37 conductor pattern of patch antenna (passive element)
38 patch antenna
39 ground layer
41, 41 opening
43 interlayer connection conductor
45 interlayer connection conductor
50 ground layer
51 feed element of patch antenna
52 transmission line
53 interlayer connection conductor
55, 56 interlayer connection conductor
57 wiring pattern
60 CPU
61 baseband integrated circuit element

The invention claimed is:

1. A wireless communication module comprising:
a dielectric substrate;
a ground layer disposed within the dielectric substrate;
an antenna pattern disposed so as to be closer to a first surface of the dielectric substrate than the ground layer is and operating as an antenna;
a high-frequency device mounted in or on a second surface of the dielectric substrate opposite to the first surface, and supplying a high-frequency signal to the antenna pattern; and
a plurality of signal conductor columns and a plurality of ground conductor columns projecting from the second surface and comprising a conductive material,
wherein each of the signal conductor columns is connected to the high-frequency device by a wiring pattern provided in or on the dielectric substrate,
wherein each of the ground conductor columns is connected to the ground layer, and
wherein an end of each of the plurality of signal conductor columns and an end of each of the plurality of ground conductor columns are electrically connected to terminals of a mounting substrate,
wherein the end of at least one of the plurality of signal conductor columns is connected to the mounting substrate by a solder bump, and
wherein the end of at least one of the plurality of ground conductor columns is connected to the mounting substrate by a solder bump.

2. The wireless communication module according to claim 1,
 wherein the antenna pattern includes a plurality of dipole antennas arranged along at least a portion of an outer periphery of the dielectric substrate,
 wherein the wireless communication module further comprises a reflector pattern positioned further inside than the dipole antennas when viewed in a plan view and serving as a reflector of the dipole antennas and an interlayer connection conductor connecting the reflector pattern to the plurality of ground conductor columns, and
 wherein the ground conductor columns serve as reflectors of the dipole antennas together with the reflector pattern.

3. The wireless communication module according to claim 1,
 wherein the antenna pattern further includes conductor patterns for a plurality of patch antennas, the conductor patterns being positioned further inside than the dipole antennas.

4. The wireless communication module according to claim 1,
 wherein the antenna pattern is configured to operate in a bandwidth of 60 GHz,
 wherein the plurality of ground conductor columns are arranged so as to surround the high-frequency device when viewed in a plan view, and
 wherein a center-to-center distance between adjacent ones of the ground conductor columns is not more than one-quarter of an effective wavelength of radio waves at a frequency of 30 GHz.

5. The wireless communication module according to claim 4,
 wherein the center-to-center distance between adjacent ones of the ground conductor columns is not more than one-twelfth of the effective wavelength of radio waves at a frequency of 30 GHz.

6. The wireless communication module according to claim 1, further comprising:
 a sealing-resin layer disposed on the second surface of the dielectric substrate, wherein the high-frequency device, the signal conductor columns, and the ground conductor columns are embedded in the sealing-resin layer.

7. The wireless communication module according to claim 1, further comprising:
 a frame-shaped substrate joined to the second surface of the dielectric substrate and surrounding the high-frequency device when viewed in a plan view,
 wherein the signal conductor columns and the ground conductor columns are accommodated in through holes formed in the frame-shaped substrate.

8. The wireless communication module according to claim 1, wherein:
 the wireless communication module is mounted on the mounting substrate and a baseband integrated circuit (IC) is mounted on the mounting substrate.

9. The wireless communication module according to claim 8, further comprising:
 a central processing unit (CPU) mounted on the mounting substrate.

* * * * *

UNITED STATES PATENT AND TRADEMARK OFFICE
CERTIFICATE OF CORRECTION

PATENT NO. : 10,498,025 B2
APPLICATION NO. : 16/230064
DATED : December 3, 2019
INVENTOR(S) : Ryuken Mizunuma It is certified that error appears in the above-identified patent and that said Letters Patent is hereby corrected as shown below:

In the Specification

Column 12, Line 24, "37 conductor pattern" should read -- 38 conductor pattern --

Column 12, Line 25, "38 patch antenna" should read -- 39 patch antenna --

Column 12, Line 26, "39 ground layer" should read -- 40 ground layer --

Signed and Sealed this
Sixth Day of October, 2020

Andrei Iancu
*Director of the United States Patent and Trademark Office*